US006838367B1

(12) United States Patent
Rhodes

(10) Patent No.: US 6,838,367 B1
(45) Date of Patent: Jan. 4, 2005

(54) METHOD FOR SIMULTANEOUS FORMATION OF FUSE AND CAPACITOR PLATE AND RESULTING STRUCTURE

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 09/644,700

(22) Filed: Aug. 24, 2000

(51) Int. Cl.$^7$ ...................... H01L 21/44; H01L 21/336; H01L 29/00
(52) U.S. Cl. ...................... 438/601; 438/132; 438/215; 438/281; 257/529
(58) Field of Search ................................ 438/132, 215, 438/281, 333, 467, 601; 257/50, 209, 529

(56) References Cited

U.S. PATENT DOCUMENTS

| 3,591,917 A | * | 7/1971 | Shira et al. ................. 219/118 |
| 3,720,877 A | * | 3/1973 | Zarowin ....................... 372/56 |
| 3,801,337 A | * | 4/1974 | Conwicke ................... 501/153 |
| 3,862,846 A | * | 1/1975 | Smoak et al. ............... 501/151 |
| 3,930,304 A | * | 1/1976 | Keller et al. ................... 438/6 |
| 3,957,451 A | * | 5/1976 | Rasmussen et al. .......... 75/246 |
| 4,042,950 A |   | 8/1977 | Price |
| 4,049,250 A | * | 9/1977 | Schmidt ...................... 266/275 |
| 4,598,462 A |   | 7/1986 | Chandrasekhar |
| 4,628,590 A | * | 12/1986 | Udo et al. ...................... 438/6 |
| 5,089,875 A |   | 2/1992 | Koyama |
| 5,189,503 A |   | 2/1993 | Suguro et al. |
| 5,364,468 A |   | 11/1994 | Cho |
| 5,391,518 A |   | 2/1995 | Bhushan |
| 5,608,257 A | * | 3/1997 | Lee et al. ................... 257/529 |
| 5,663,590 A |   | 9/1997 | Kapoor |
| 5,696,018 A | * | 12/1997 | Summerfelt et al. ........ 438/396 |
| 5,888,877 A | * | 3/1999 | Dennison et al. ........... 438/386 |
| 5,891,762 A | * | 4/1999 | Sakai et al. ................. 438/132 |
| 5,972,756 A | * | 10/1999 | Kono et al. ................. 438/281 |
| 6,057,180 A | * | 5/2000 | Sun et al. ................... 438/132 |
| 6,078,644 A | * | 6/2000 | Day et al. ................... 378/144 |
| 6,100,117 A | * | 8/2000 | Hao et al. ................... 438/132 |
| 6,372,554 B1 | * | 4/2002 | Kawakita et al. ........... 438/132 |

FOREIGN PATENT DOCUMENTS

JP        10-150164 A   *  6/1998    ......... H01L/27/108

* cited by examiner

Primary Examiner—Matthew Smith
Assistant Examiner—Lex H. Malsawma
(74) Attorney, Agent, or Firm—Dickstein Shapiro Morin & Oshinsky LLP

(57) ABSTRACT

An improved method for forming a fuse element is disclosed. During the formation of the upper capacitor plate in a capacitor structure, metals or their alloys are simultaneously patterned as an upper capacitor plate and as a fuse.

43 Claims, 7 Drawing Sheets

METHOD FOR SIMULTANEOUS FORMATION OF FUSE AND CAPACITOR PLATE AND RESULTING STRUCTURE

FIELD OF THE INVENTION

The present invention relates to the field of semiconductor integrated circuits and, in particular, to electrodes for capacitors that can also be simultaneously patterned as fuse elements.

BACKGROUND OF THE INVENTION

A fuse or a fusible link is a portion of conductor interconnecting two or more regions of a semiconductor device, which can be severed under predetermined conditions. For example, when a sufficiently high current is passed through the conductor, the fuse will heat up and eventually melt, thereby "blowing" the fuse and severing the electrical connection between the semiconductor regions. In earlier DRAM generations, fuses were typically formed of aluminum or aluminum-copper alloys. More recently, fuses for integrated circuits (IC) are made from a variety of materials, such as polycrystalline silicon, nichrome, or titanium-tungsten (TiW) alloys, among others.

Prior art methods for formation of either a vertical or a horizontal fuse typically involve several processing steps, which add to the processing time and expense of the manufacturing process. To minimize the additional processing steps the prior art has tried to integrate and/or associate the formation of the fuse elements with the formation of different conductive regions of a semiconductor substrate. For example, U.S. Pat. No. 4,598,462 teaches a fuse comprising platinum silicide associated with, and formed integral to, at least a well region. Similarly, U.S. Pat. No. 5,663,590 discloses a metallization process in which metal stringers are purposely left on sidewalls of a rectangular recess so that they can serve as fuses, which are then connected to one or more metal lines. None of these technologies, however, minimize the number of processing steps actually required to form the fuse.

Accordingly, there is a need for an improved method for fabricating an IC fuse which uses minimal processing steps.

SUMMARY OF THE INVENTION

The present invention provides a method for the fabrication of a fuse element simultaneously with a top plate electrode for a capacitor, for example, a metal-insulator-metal (MIM) or a metal-insulator-semiconductor (MIS) capacitor, during a second-level metal deposition. When the metal film for the top plate electrode is deposited for the capacitor, the deposition also includes a deposition of the same film for use as fuse links, which may be formed adjacent to the capacitor structure and/or elsewhere on a semiconductor device. The invention provides, therefore, a method of forming fuse links which may be fabricated at the same time as the fabrication of the top plate electrode, thereby reducing the steps required for fabrication of the fusible links.

The foregoing and other advantages and features of the invention will be better understood from the following detailed description of the invention, which is provided in connection with the accompanying drawings.

DETAILED DESCRIPTION OF THE DRAWINGS

DETAILED DESCRIPTION OF THE PREFERRED EMBODIMENTS

Figure 1:
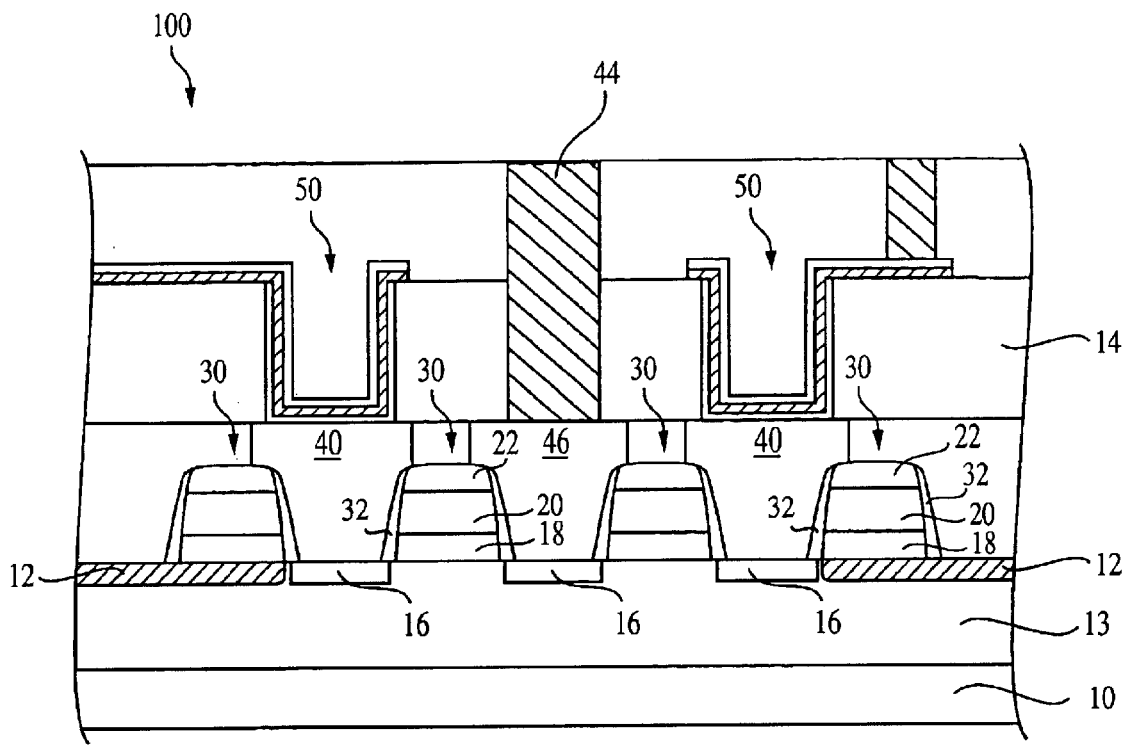
FIG. 1 is a schematic cross-sectional view of a portion of a representative substrate of a conventional memory DRAM device and a conventional MIM capacitor at an intermediate stage of processing, and in accordance with the prior art.

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made.

The term "substrate" used in the following description may include any semiconductor-based structure that has an exposed silicon surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor also need not be silicon-based. The semiconductor could be silicon-germanium, germanium, or gallium arsenide. When reference is made to a substrate in the following description, previous process steps may have been utilized to form regions or junctions in or on the base semiconductor or foundation.

The term "metal" is intended to include not only elemental metals, but metals with other trace metals or in various alloyed combinations with other metals as known in the semiconductor art, as long as such alloy is conductive. Similarly, the term "noble metal" is intended to include not only elemental noble metals, but noble metals with other trace metals or in various alloyed combinations with other metals as known in the semiconductor art, as long as such alloy is conductive.

The present invention provides a method for the simultaneous fabrication of a fuse element and of a top plate electrode for a capacitor during the second-level metal deposition. When the metal film used during a second-level metal deposition forms the top plate electrode by being deposited in the capacitor, the same metal film is used for the patterning of fuse links adjacent to the capacitor structure and/or elsewhere on a semiconductor device, such as at is the periphery of a fabricated device. The invention provides, therefore, a method for fuse formation, which has improved reliability and few processing steps.

Although the present invention will be described below with reference to a metal-insulator-metal (MIM) capacitor (FIGS. 2–11) that has an upper capacitor plate formed of a noble metal, it must be understood that the present invention is not limited to MIM capacitors having a noble metal upper capacitor plate, but it also covers other capacitor structures, such as, for example, conventional capacitors or metal-insulator-semiconductor (MIS) capacitors used in the fabrication of various IC memory cells; as long as the upper capacitor plate is formed of a conductor which can also be used as a fuse element. Thus, although a preferred metal film used for the patterning of the fuse element is a noble metal, other conventional metals, metal alloys or conductive materials may also be employed, according to the particular type of capacitor structure that is to be formed.

Referring now to the figures, where like elements are designated by like reference numerals, FIG. 1 shows a portion 100 of a conventional DRAM memory at an intermediate stage of the fabrication. A pair of memory cells having respective access transistors are formed on a substrate 10 having a doped well 13, which is typically doped to a predetermined conductivity, e.g. p-type or n-type depending on whether NMOS or PMOS transistors will be formed. The structure further includes field oxide regions 12, conventional doped active areas 16, and a pair of gate stacks 30, all formed according to well-known semiconductor processing techniques. The gate stacks 30 include an oxide layer 18, a conductive gate layer 20, nitride spacers 32 formed of an oxide or a nitride, and a nitride cap 22 which can be formed of an oxide, an oxide/nitride, or a nitride. The conductive gate layer 20 could be formed, for example, of a layer of doped polysilicon, or a multi-layer structure of polysilicon/$WSi_x$, polysilicon/$WN_x$/W or polysilicon/$TiSi_2$.

Further illustrated in FIG. 1 are two MIM capacitors 50 formed in an insulating layer 14, which are connected to active areas 16 by two respective conductive plugs 40. The DRAM memory cells also include a bit line contact 44, which is further connected to the common active area 16 of the access transistors by another conductive plug 46. The access transistors respectively write charge into and read charge from capacitors 50, to and from the bit line contact 44.

Figure 2:
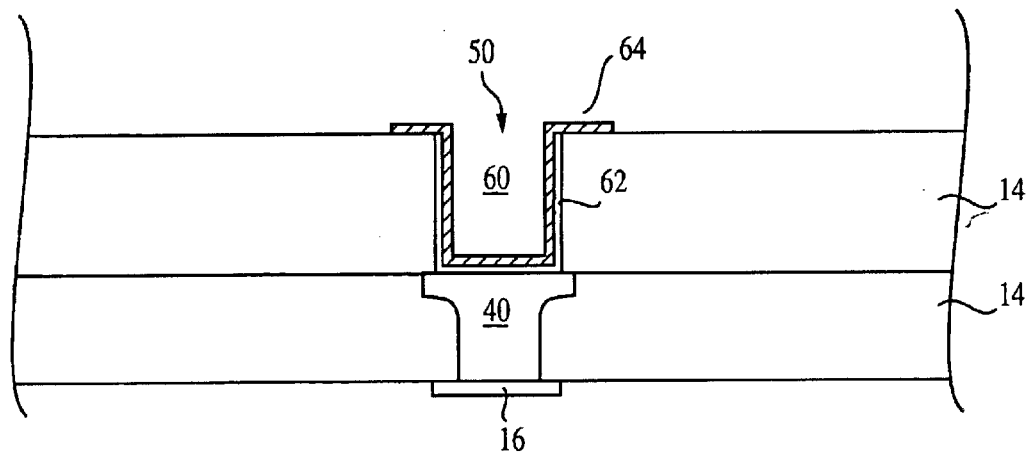
FIG. 2 is a schematic cross-sectional view of the upper-right portion of the representative substrate of FIG. 1, depicting the MIM capacitor at an intermediate stage of processing and in accordance with the prior art.

Reference is now made to FIG. 2, which for simplicity of description illustrates only the upper-right portion of the FIG. 1 structure, that is the MIM capacitor 50. As known in the art, the processing steps for the fabrication of the MIM capacitor 50 within a via 60 (FIG. 2) provided in the insulating layer 14 include a first-level metallization 62, a dielectric film deposition 64, and a second-level metallization. For example, FIG. 2 illustrates the MIM capacitor 50 after formation of the dielectric film 64. As such, a lower capacitor plate 62, also called a bottom electrode, has already been formed during the first-level metallization. Since the manner of formation of via 60 and the subsequent metallization steps are well known processes in the art, these processes will not be described herein in detail.

The material for the lower capacitor plate 62 is typically selected from the group of metals, or metal compositions and alloys, including but not limited to osmium (Os), platinum (Pt), rhodium (Rh), ruthenium (Ru), palladium (Pd), iridium (Ir), and their alloys.

Following the first-level deposition, the first level metallization is removed from the top surface regions typically by resist coat and CMP or dry etch. A high dielectric film 64 (FIG. 2) is formed over the lower capacitor plate 62. The most common high dielectric material used in MIM capacitors is tantalum oxide ($Ta_2O_5$), but other materials such as silicon dioxide ($SiO_2$), silicon nitride ($Si_3N_4$), strontium titanate ($SrTiO_3$), alumina ($Al_2O_3$), barium strontium titanate ($BaSrTiO_3$), or zirconium oxide ($ZrO_2$) may also be used. Further, perovskite oxide dielectric films of the paraelectric type, such as lead titanate ($PbTiO_3$) or lead zirconite ($PbZrO_3$), are also good candidates for high dielectric film materials even if their dielectric constant is slightly lower than that of the above mentioned dielectrics. As known in the art, the thickness of the high dielectric film 64 determines the capacitance per unit area of the MIM capacitor 50.

Figure 3:
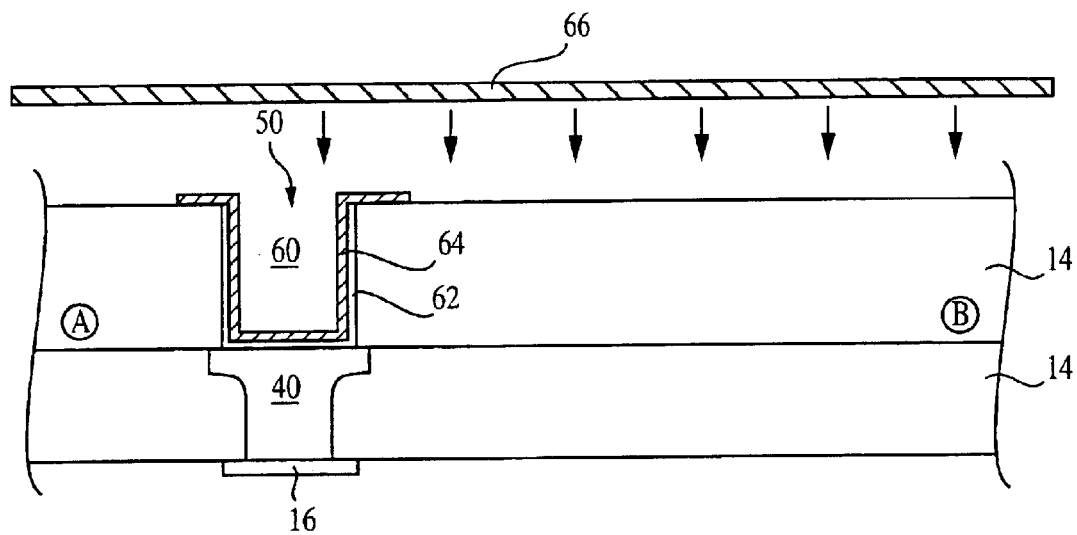
FIG. 3 is a schematic cross-sectional view of the representative substrate of FIG. 2, at a stage of processing subsequent to that shown in FIG. 2, and in accordance with the present invention.

Reference is now made to FIG. 3 which represents a cross-sectional view of two regions A, B of the insulating layer 14, with region A housing the MIM capacitor 50. The two regions A, B may be adjacent to each other, or may be separated by other intermediate IC regions on which various IC elements may be formed in accordance with the requirements of the particular device.

After the formation of the dielectric film 64 (FIG. 2), a second-level metallization is performed during which a metal film 66 is formed and patterned over both regions A and B of the substrate 14. The metal film 66 is patterned over both regions A and B, so that parts of the metal him 66 form an upper capacitor plate 68 (FIG. 4) situated over the dielectric film 64, while parts of same metal film 66 form a fuse element or metal line 72 (FIG. 4) situated on top of upper surface 15 of the region B with the dielectric 64 in between the metal film 72 and the upper surface 15. This way, the deposition of the metal film 66 and its patterning allows the simultaneous formation of both the upper capacitor plate 68 of the MIM capacitor 50 and the fuse element 72, which will subsequently form a noble metal fuse 70 (FIG. 11), as it will be described in more detail below.

Figure 4:
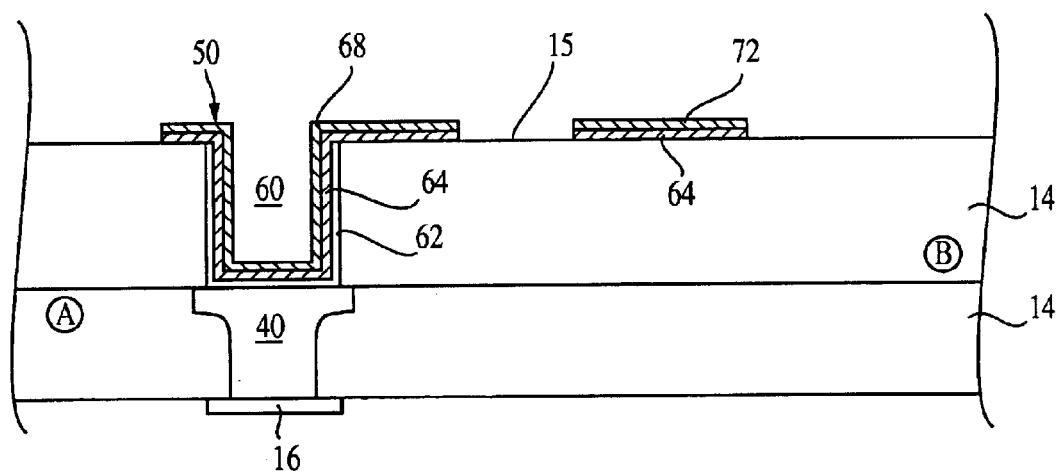
FIG. 4 is a schematic cross-sectional view of the representative substrate of FIG. 2, at a stage of processing subsequent to that shown in FIG. 3, and in accordance with the present invention.

The material for both the fuse element 72 and the upper capacitor plate 68 of FIG. 4 may be any conductive material suitable for use as a capacitor cell plate and is preferably a noble metal, such as platinum (Pt), osmium (Os), palladium (Pd), rhodium (Rh), ruthenium (Ru), iridium (Ir), or their corresponding alloys. Noble metals, in particular platinum, are preferred since noble metals provide excellent capacitor characteristics and form excellent fuses.

Figure 5:
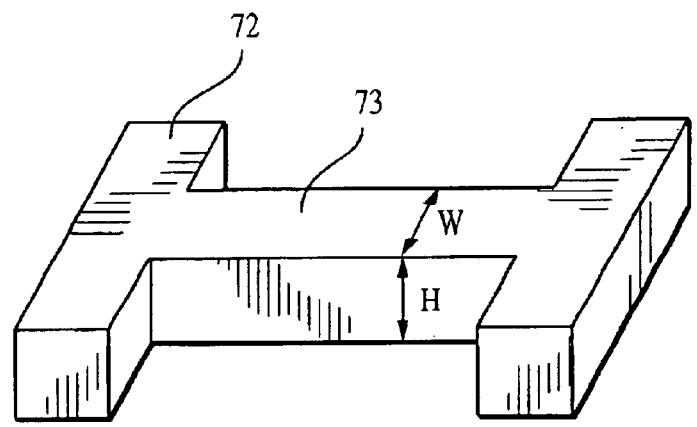
FIG. 5 is a three dimensional view of the noble metal fuse element of FIG. 3.
Figure 6:
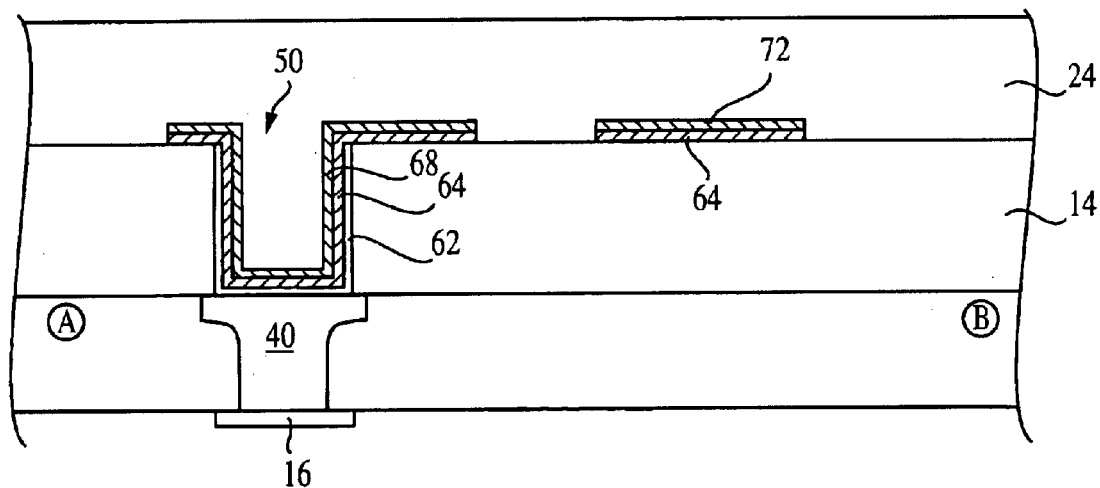
FIG. 6 is a schematic cross-sectional view of the representative substrate of FIG. 2, at a stage of processing subsequent to that shown in FIG. 4, and in accordance with the present invention.

Referring now to FIG. 5, the fuse element 72 has been patterned to have a portion 73 of reduced cross-sectional area in accordance with a pre-established fuse pattern. The portion 73 of the fuse element 72 defines the current and time characteristics for blowing the fuse. The minimal cross-section of portion 73 allows the fuse to blow or electrically open when electrical power through the fuse exceeds a preselected threshold power. Thus, thickness H (FIG. 5) of the portion 73 of the fuse element 72 has a predefined value, in a range of about 100 Angstroms to about 2,000 Angstroms. Similarly, the width of the portion 73, which is represented by dimension W of FIG. 5, has a range of about 500 Angstroms to about 10,000 Angstroms.

After formation of the fuse element 72 and upper capacitor plate 68, a second insulating layer 24 (FIG. 6) is formed over the fuse element 72 and the MIM capacitor 50. The second insulating layer 24 may be formed, for example, of silicon oxide, TEOS, HDP oxide, borophosphosilicate glass (BPSG), borosilicate glass (BSG) or phosphosilicate glass (PSG), to a thickness of between about 1,000 Angstroms to about 7,000 Angstroms, preferably of about 3,000 Angstroms.

Figure 7:
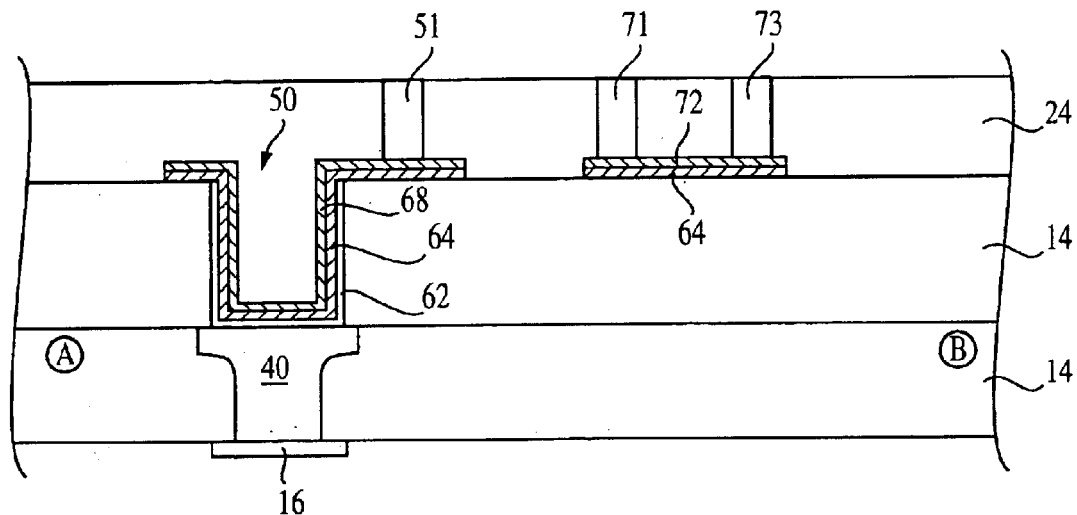
FIG. 7 is a schematic cross-sectional view of the representative substrate of FIG. 2, at a stage of processing subsequent to that shown in FIG. 6, and in accordance with the present invention.

In the next step, insulating layer 24 is masked and etched to form two contact holes 71, 73, in region B of the substrate 14, as shown in FIG. 7. Masking and etching of the contact holes 71, 73 are well known photolithography processes and they will not be described in detail. Insulating layer 24 of region A of the substrate 14 may be also masked and etched to form a via 51, as also illustrated in FIG. 7. Via 51 allows further electrical connection of the MIM capacitor 50 with electrical conductors formed over it.

Figure 8:
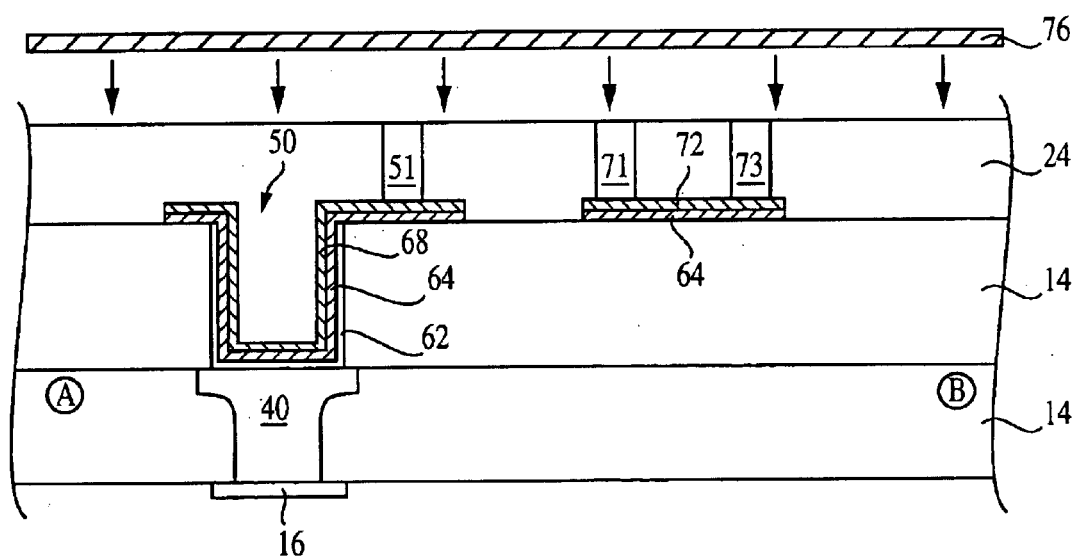
FIG. 8 is a schematic cross-sectional view of the representative substrate of FIG. 2, at a stage of processing subsequent to that shown in FIG. 7, and in accordance with the present invention.
Figure 9:
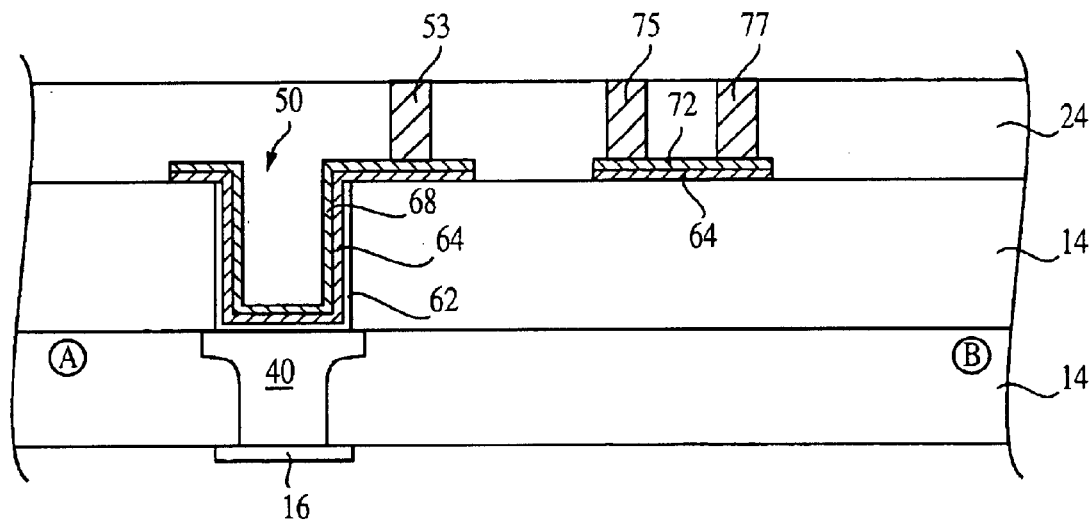
FIG. 9 is a schematic cross-sectional view of the representative substrate of FIG. 2, at a stage of processing subsequent to that shown in FIG. 8, and in accordance with the present invention.

In FIG. 8, a metal layer 76 is blanket deposited over both regions A and B of the substrate 14. Metal layer 76 (FIG. 8) may be any conductive material conventionally used in trench formation and its subsequent filling, such as cobalt (Co), titanium nitride (TiN), tungsten (W), titanium (Ti), titanium tungsten (TiW), copper (Cu), aluminum (Al), aluminum doped with copper (Al(Cu)), or a noble metal from the group described above with reference to the formation of the fuse element 72 (FIGS. 4–7) and the upper capacitor plate 68 (FIG. 4), or a layered stack of these metals such as Ti/TiN/W. After its deposition, metal layer 76 is planarized down to or near the planar surface of the second insulating layer 24, to form fuse contacts 75, 77 (FIG. 9) and capacitor contact 53 (FIG. 9), respectively. Although any conductive material may be used to fill the contact holes 71, 73 and the via 51, for simplicity, the fuse contacts 75, 77 will be referred to as metal fuse contacts 75, 77. Similarly, the capacitor contact 53 will be referred to as to metal capacitor contact 53.

Figure 10:
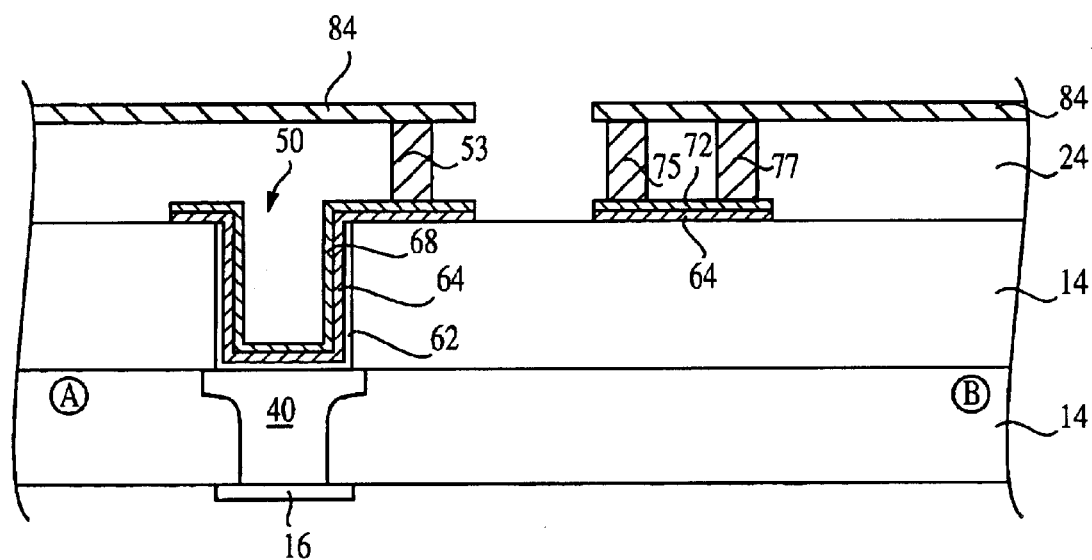
FIG. 10 is a schematic cross-sectional view of the representative substrate of FIG. 2, at a stage of processing subsequent to that shown in FIG. 9, and in accordance with the present invention.

Referring now to FIG. 10, an interconnect conductive layer 84 is deposited over the insulating layer 24 and over the metal fuse contacts 75, 77 and the metal capacitor contact 53. Conductive layer 84 is used to form metal lines to interconnect various devices formed on alia in the substrate 14, such as, for example the MIM capacitor 50. Conductive layer 84 also connects the metal fuse contacts 75, 77. Preferred materials for the conductive layer 84 are any conductive metals or materials, such as for example, cobalt (Co), titanium nitride (TiN), tungsten (W), titanium tungsten (TiW), copper (Cu), aluminum (Al), aluminum doped with copper (Al(Cu)), a noble metal, or a layer stack of these metals such as Ti/Al(Cu)/TiN. Also, the material of the conductive layer 84 may be similar to, or different than, that of the metal layer 76 (FIG. 8), depending on the particular processing requirements of the IC device.

Figure 11:
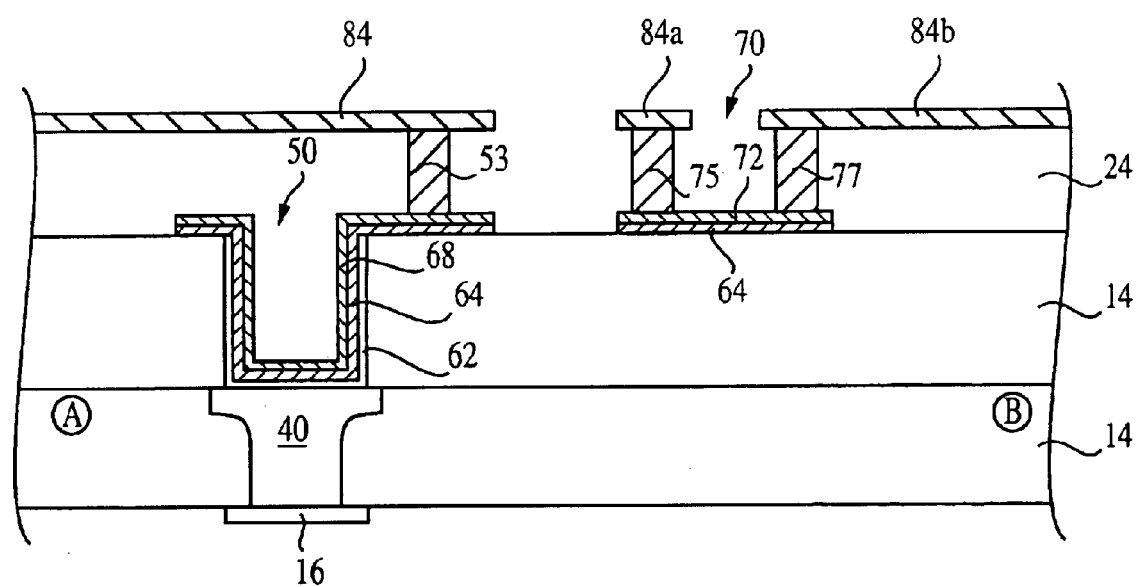
FIG. 11 is a schematic cross-sectional view of the representative substrate of FIG. 2, at a stage of processing subsequent to that shown in FIG. 10, and in accordance with the present invention.

Next, conductive layer 84 (FIG. 10) is dry etched to form metal line 84a (FIG. 11) over the metal fuse contact 75 and metal line 84b (FIG. 11) over the metal fuse contact 77. This way, as illustrated in FIG. 11, a noble metal fuse 70 is formed by the fuse element 72, the metal fuse contacts 75, 77 and the metal lines 84a, 84b. In the preferred embodiment of the present invention, the conductive layer 84 (FIG. 10) is dry etched by means of a well known RIE dry etching process.

Although the formation of the fuse 70 (FIG. 11) of the present invention has been described above with reference to the simultaneous fabrication of the fuse element 72 and of the upper capacitor plate 68 of the MIM capacitor 50, it must be understood that the present invention is not limited to the described embodiment.

Further, although the present invention has been described with reference to an upper capacitor plate of an MIM capacitor, it must be understood that the present invention also applies to other capacitor structures, as long as the formation of the upper capacitor plate allows the simultaneous patterning of a fuise element. For example, the fuse 70 of FIG. 11 may be also formed with a metal-insulator-semiconductor (MIS) capacitor and also with capacitor geometries other than the container capacitors shown. In such case, the lower capacitor plate, the high dielectric material, and the upper capacitor plate would be formed according to well-known methods of the prior art, and, of course, using respective suitable materials. Nevertheless, the processing steps for the simultaneous formation of a fuse element and of an upper capacitor plate would be similar to those employed in the fabrication of the fuse 70, described above with reference to the MIM capacitor 50 in FIGS. 3–11.

Figure 12:
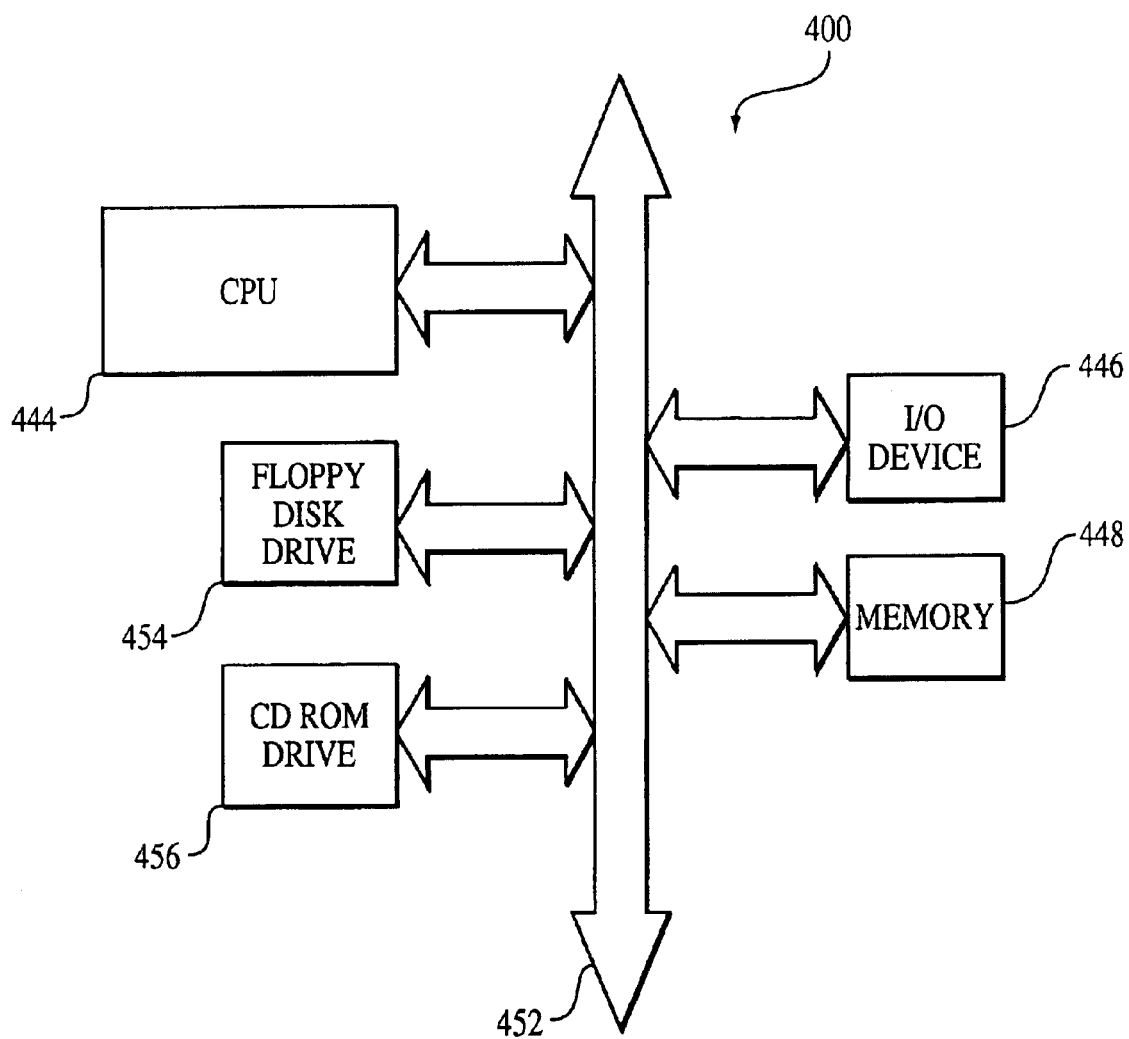
FIG. 12 is an illustration of a computer system having a memory cell with a fuse structure formed in accordance with a method of the present invention.

The fuse 70 of FIG. 11 fabricated in accordance with the process of the present invention could be used in any integrated circuit structure where a fuse is needed, such as in a processor or a memory device, or other integrated circuit. For example, fuse 70 could further be part of a typical processor based system, which is illustrated generally at 400 in FIG. 12. A processor system, such as a computer system, generally comprises a central processing unit (CPU) 444, such as a microprocessor, which communicates with an input/output (I/O) device 446 over a bus 452. A memory 448, for example a DRAM memory, a SRAM memory, or a Multi Chip Module (MCM), also communicates with the CPU 444 over bus 452. Either the processor and/or memory or other circuit elements fabricated as an integrated circuit may use a fuse link, such as fuse 70 fabricated as described above with reference to FIGS. 3–11.

In the case of a computer system, the processor system may include additional peripheral devices such as a floppy disk drive 454, and a compact disk (CD) ROM drive 456 which also communicate with CPU 444 over the bus 452. The memory 448 may be combined with a processor, such as a CPU, digital signal processor or microprocessor, with or without memory storage, in a single integrated circuit chip.

The above description illustrates preferred embodiments that achieve the features and advantages of the present invention. It is not intended that the present invention be limited to the illustrated embodiments. Modifications and substitutions to specific process conditions and structures can be made without departing from thee spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method for forming a fuse over a semiconductor substrate, comprising the steps of:

providing a lower capacitor plate of a container capacitor over a substrate;

providing a dielectric layer over said lower capacitor plate and said substrate;

forming a conductive layer over said substrate and said dielectric layer, wherein said conductive layer comprises a material selected from the group comprising of metals and metal alloys; and patterning said conductive layer and said dielectric layer at the same time to simultaneously form an upper capacitor plate over a portion of said dielectric layer and at least one fuse element over another portion of said dielectric layer, wherein all portions of said conductive layer of said upper capacitor plate have the same thickness of the conductive layer of said at least one fuse element.

2. The method of claim 1 further comprising the step of forming conductive interconnects to said fuse element.

3. The method of claim 2, wherein said step of forming said conductive interconnects further comprises depositing an insulating layer over said fuse element and forming a plurality of metal contacts within said insulating layer.

4. The method of claim 1, wherein said upper capacitor plate is adjacent to said fuse element.

5. The method of claim 1, wherein said conductive layer is a metal layer.

6. The method of claim 1, wherein said conductive layer is platinum or a platinum alloy.

7. The method of claim 1, wherein said conductive layer is palladium or a palladium alloy.

8. The method of claim 1, wherein said conductive layer is osmium or an osmium alloy.

9. The method of claim 1, wherein said conductive layer is ruthenium or a ruthenium alloy.

10. The method of claim 1, wherein said conductive layer is rhodium or a rhodium alloy.

11. The method of claim 1, wherein said conductive layer is iridium or an iridium alloy.

12. The method of claim 1, wherein said conductive layer is cobalt or a cobalt alloy.

13. The method of claim 1, wherein said conductive layer is copper or a copper alloy.

14. The method of claim 1, wherein said conductive layer is titanium nitride.

15. The method of claim 1, wherein said conductive layer is titanium tungsten.

16. The method of claim 1, wherein said conductive layer is titanium nitride/polysilicon.

17. The method of claim 1, wherein said conductive layer is metal/polysilicon.

18. The method of claim 1, wherein said conductive layer is a metal nitride.

19. The method of claim 1, wherein said conductive layer is a layered stack of metals.

20. The method of claim 19, wherein said conductive layer is a layered stack of titanium/titanium nitride/tungsten.

21. The method of claim 1, wherein said conductive layer is a noble metal layer.

22. The method of claim 1, wherein said capacitor is an MIM capacitor.

23. The method of claim 1, wherein said capacitor is an MIS capacitor.

24. A semiconductor device comprising:
a semiconductor substrate; and
a metal layer formed over said semiconductor substrate, said metal layer being patterned to comprise one portion formed as an upper capacitor plate portion of a container capacitor and another portion formed as a fuse element portion, wherein said upper capacitor plate portion is adjacent to said fuse element portion, said fuse element is formed to have a reduced cross-sectional area that is from about 100 A to about 2000 A thick and from about 500 A to about 10,000 A wide, wherein said metal layer of said upper capacitor plate has the same thickness of the metal layer of said fuse element portion.

25. The semiconductor device of claim 24, wherein said metal layer is a noble metal layer.

26. The semiconductor device of claim 24, wherein said capacitor is an MIM capacitor.

27. The semiconductor device of claim 24, wherein said capacitor is an MIS capacitor.

28. A memory device, comprising:
a substrate;
a memory cell formed over said substrate, said memory cell comprising a transistor including a gate fabricated on said substrate, and source and drain regions in said substrate disposed adjacent to said gate;
a container capacitor for charge storage; and
a metal layer formed over said semiconductor substrate, said metal layer being patterned to comprise one portion formed as an upper capacitor plate portion of said container capacitor and another portion formed as a fuse element portion, wherein said upper capacitor plate portion is adjacent to said fuse element portion, said fuse element portion formed over a dielectric layer and is from about 100 A to about 2000 A thick and about 500 A to about 10,000 A wide, wherein said metal layer of said upper capacitor plate has the same thickness of the metal layer of said fuse element portion.

29. The memory cell of claim 28, wherein said upper capacitor plate portion is part of an MIM capacitor.

30. The memory cell of claim 28, wherein said metal layer is a noble metal layer.

31. The memory cell of claim 28, wherein said upper capacitor plate portion is part of an MIS capacitor.

32. The memory cell of claim 28, wherein said memory cell is a DRAM memory.

33. The memory cell of claim 28, wherein said memory cell is a SRAM memory.

34. The memory cell of claim 28, wherein said memory cell is a MCM memory.

35. A processor-based system comprising:
a processor; and
an integrated circuit coupled to said processor, at least one of said integrated circuit and processor comprising a metal layer formed over a semiconductor substrate, said metal layer being patterned to comprise one portion formed as an upper capacitor plate portion of a container capacitor and another portion formed as a fuse element portion, wherein said upper capacitor plate portion is adjacent to said fuse element portion, said fuse element portion formed over a dielectric layer and is from about 100 A to about 2000 A thick and about 500 A to about 10,000 A wide, wherein said metal layer of said upper capacitor plate has the same thickness of the metal layer of said fuse element portion.

36. The processor-based system of claim 35, wherein said upper capacitor plate portion is part of an MIM capacitor.

37. The processor-based system of claim 35, wherein said fuse element is a noble metal fuse element.

38. The processor-based system of claim 35, wherein said upper capacitor plate portion is part of an MIS capacitor.

39. The processor-based system of claim 35, wherein said integrated circuit is a memory module.

40. The processor-based system of claim 39, wherein said memory module is a DRAM memory.

41. The processor-based system of claim 39, wherein said memory module is a SRAM memory.

42. The processor-based system of claim 39, wherein said memory module is a MCM memory.

43. A method for forming a fuse over a semiconductor substrate, comprising the steps of:

providing a lower capacitor plate of a container capacitor over a substrate;

providing a dielectric layer over said lower capacitor plate and said substrate;

forming a conductive layer over said substrate and said dielectric layer; and patterning said conductive layer to form at least one upper capacitor plate over a portion of said dielectric layer and at least one fuse element portion over another portion of said dielectric layer at the same time, wherein all portions of said conductive layer of said upper capacitor plate have the same thickness of the conductive layer of said fuse element portion.

\* \* \* \* \*

UNITED STATES PATENT AND TRADEMARK OFFICE
CERTIFICATE OF CORRECTION

PATENT NO. : 6,838,367 B1
DATED : January 4, 2005
INVENTOR(S) : Howard E. Rhodes It is certified that error appears in the above-identified patent and that said Letters Patent is hereby corrected as shown below:

Column 1,
Line 23, "polycrystaliine" should read -- polycrystalline --;

Column 5,
Line 52, "alia" should read -- and --;

Column 8,
Lines 6, 31 and 58, "100 A to about 2000 A" should read -- 100 Å to about 2000 Å --; and
Line 7, "500 A to about 10,0000 A" should read -- 500 Å to about 10,000 Å --.
Lines 32 and 59, "500 A to about 10,000 A" should read -- 500 Å to about 10,000 Å --.

Signed and Sealed this

Thirteenth Day of December, 2005

JON W. DUDAS
*Director of the United States Patent and Trademark Office*